(12) United States Patent
Nakano et al.

(10) Patent No.: US 6,593,522 B2
(45) Date of Patent: Jul. 15, 2003

(54) SOLAR CELL DEVICE

(75) Inventors: Shingo Nakano, Shijyonawate (JP); Masaki Shima, Uji (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/817,202

(22) Filed: Mar. 27, 2001

(65) Prior Publication Data

US 2001/0037825 A1 Nov. 8, 2001

(30) Foreign Application Priority Data

Mar. 29, 2000 (JP) .......................... 2000-091283
Mar. 12, 2001 (JP) .......................... 2001-069015

(51) Int. Cl.[7] .................... H01L 31/052; H01L 31/04
(52) U.S. Cl. ................ 136/256; 136/252; 136/246; 136/259; 257/436; 257/466
(58) Field of Search .................. 136/256, 252, 136/246, 259; 257/436, 466

(56) References Cited

U.S. PATENT DOCUMENTS

| | | | | |
|---|---|---|---|---|
| 4,419,533 A | * | 12/1983 | Czubatyj et al. | 136/259 |
| 4,530,739 A | * | 7/1985 | Hanak et al. | 427/74 |
| 5,282,902 A | * | 2/1994 | Matsuyama | 136/249 |
| 5,620,530 A | * | 4/1997 | Nakayama | 136/259 |
| 6,172,296 B1 | * | 1/2001 | Iwasaki et al. | 136/256 |
| 6,331,672 B1 | * | 12/2001 | Matsuda et al. | 136/256 |
| 6,465,727 B2 | * | 10/2002 | Maruyama et al. | 136/256 |
| 6,512,170 B1 | * | 1/2003 | Hirata et al. | 136/256 |
| 2002/0050289 A1 | * | 5/2002 | Wada et al. | 136/256 |

FOREIGN PATENT DOCUMENTS

EP 793277 A2 * 9/1997

* cited by examiner

Primary Examiner—Alan Diamond
(74) Attorney, Agent, or Firm—Arent Fox Kintner Plotkin & Kahn

(57) ABSTRACT

A thin film semiconductor layer (3) for serving as a photovoltaic layer is formed on a substrate 1 of a metal foil formed by electroforming. A surface of the metal foil of the substrate 1 is formed in a rough shape of approximately 0.1–10 $\mu$m of mean roughness depth (Rz).

8 Claims, 3 Drawing Sheets

SOLAR CELL DEVICE

BACKGROUND OF THE INVENTION

1. Field of the Invention

The present invention relates to a solar cell device, particularly relates to a technology for manufacturing a solar cell device having high photovoltaic conversion efficiency at low cost.

2. Description of Prior Art

A solar cell device is expected to replace fossil fuel such as petroleum and coal and to be a new energy source because it can provide clean energy without depletion. In recent year, a solar cell device for generating power for household etc. has been developed and commercialized. A solar cell device, which uses a thin film semiconductor of such as an amorphous semiconductor, is easy to increase its area, and consequently research and development of such a solar cell device have been promoted.

A structure in FIG. 9 is proposed as an example of an element of the thin film solar cell device. In FIG. 9, a substrate 21 having a rough surface for scattering light can be a substrate formed by laminating a metal layer of such as Ag and Al on a flat glass substrate with tin oxide ($SnO_2$), indium tin oxide (ITO), or zinc oxide (ZnO) interposed therebetween, a metal substrate having a rough surface, or a metal substrate coated with a metal layer having a rough surface. A photovoltaic conversion layer 22 composed of a thin semiconductor film containing mainly amorphous silicon, microcrystalline silicon or the like is formed on the substrate 21, and a transparent electrode layer 23 formed of transparent conductive material such as ITO is formed thereon. In this structure of the solar cell device, incident light such as sunlight is incident from a side of the transparent electrode film 23 formed of transparent conductive material such as ITO.

A thin film solar cell device provided with a fine rough surface on a surface of a transparent substrate capable of improving photovoltaic conversion efficiency by the aid of light confinement is also well known.

When transparent conductive material such as $SnO_2$, ITO, and ZnO having a rough shape is used to coat the glass substrate to form the substrate 21, in the solar cell device with thin film, however, cost for forming the rough shape is high, resulting in increase in total cost for the substrate.

When a metal substrate such as stainless steel is used as the substrate 21, difficulty in forming a rough shape on the surface of the metal substrate prevents reduction of cost for the thin film solar cell. In addition, reproducibility of the rough shape is not good.

Furthermore, the substrate 21 of the solar cell device is heavy. When the solar cell device is made larger to generate power, the heavy weight of the solar cell module degrades workability.

It is an objective of the invention to solve the above existing problems and to provide an inexpensive and light-weight solar cell device while obtaining high throughput in forming the rough surface.

SUMMARY OF THE INVENTION

A solar cell device according to this invention includes a photovoltaic layer of a thin film semiconductor layer having semiconductor junction in an inside formed on a metal foil formed by electroforming.

The metal foil formed by electroforming has a rough shape of approximately 0.1–10 µm, more preferably 0.1–5 µm, of mean roughness depth (Rz) on a surface of the metal foil.

This invention can provide a solar cell device for power generation capable of reducing cost for manufacture because through put in forming a rough shape, and cost for the rough-shaped metal foil substrate which is electroformed is less as compared with a substrate of a glass coated with the transparent conductive material of such as tin oxide, indium tin oxide, and zinc oxide. Furthermore, the thin film solar cell device using the rough-shaped substrate formed of a metal foil is light-weighted. Therefore, even when the size of the solar cell module increases, the weight is relatively small and workability is good.

A transparent conductive material layer can be interposed between the metal foil and the thin film semiconductor layer.

A conductive material layer and the transparent conductive material layer of high optical reflectivity can be interposed between the metal foil and the thin film semiconductor layer.

A rough shape of approximately 0.02–0.5 µm of mean roughness depth (Rz) can be formed on a surface of the transparent conductive material layer.

The transparent conductive material layer of such as tin oxide, indium tin oxide, and zinc oxide having a fine rough shape can be formed on the metal foil substrate. With this shape of the transparent conductive material layer, incident light such as sunlight can be effectively utilized and efficiency of the solar cell improves.

Figure 1:
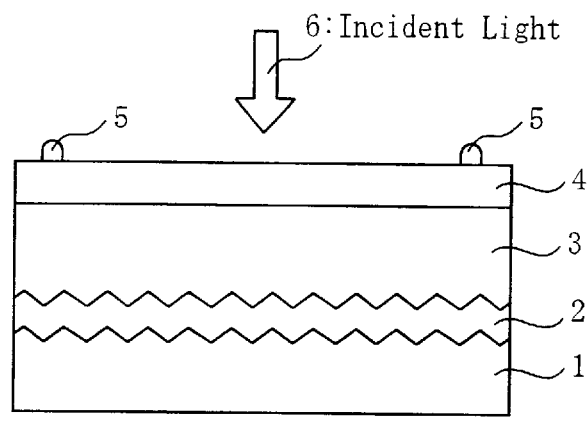
FIG. 1 is a cross sectional view illustrating a structure of a thin film solar cell device of the first embodiment according to this invention.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Explanation of embodiments of this invention by referring to the drawings follows.

FIG. 1 is a cross sectional view illustrating a structure of a thin film solar cell device of the first embodiment of the invention. A substrate 1 is a metal foil of copper, nickel, iron or the like of 10–500 μm in thickness produced by electroforming or a metal foil of alloy of these material. The substrate 1 used in this embodiment is an electroformed copper foil.

"Wet processing handbook" (FOUNDATION ADVANCED TECHNOLOGY INSTITUTE, published on Mar. 22, 1996, 108–123 pages) describes on electroforming, for example. In general, a drum is dipped in an electrolyte bath, metal is deposited on the drum to be thick, and then the electrically deposited material is peeled from the drum to produce into product or duplicate. In manufacturing a copper foil by electroforming, copper electrolyte used in electroforming is acid copper-sulfate containing copper-sulfate of 200 g/l. A drum of titan, stainless steel or the like is partially dipped in the electrolyte bath filled with the acid copper-sulfate, and electrical deposition is made on a surface of the drum. The deposited material is sequentially peeled off and a band-shaped copper foil is produced. A positive electrode is insoluble anode (lead, antimony). The copper is chemically melted and supplemented when copper ions in the electrolyte bath reduce.

The electroformed foil formed by such the method is different from a foil formed by rolling in that crystals are produced vertically to a face and an ideal rough shape for a substrate of a thin film solar cell can be obtained. The metal foil produced by the electroforming has a rough shape of approximately 0.1–10 μm of mean roughness depth (Rz).

Figure 4:
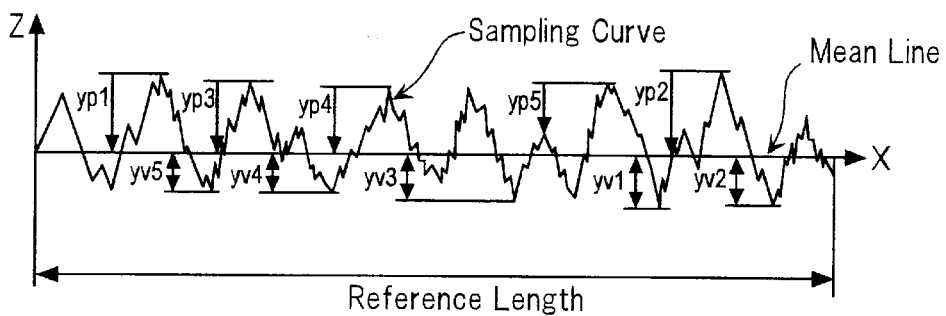
FIG. 4 is an explanatory view of mean roughness depth (Rz)

Mean roughness depth (Rz) is explained in JIS B0601-1994. As shown in FIG. 4, average of absolute values of the five highest peaks from a mean line and average of absolute values of the five deepest valleys from the mean line within a reference length L of a sampling roughness curve are added to average and minimize diversity of heights. This is a parameter expressed by the following equation 1.

$$Rz = \frac{\left|\sum_{i=1}^{5} yp_i\right| + \left|\sum_{i=1}^{5} yv_i\right|}{5} \quad \text{(Equation 1)}$$

When electrolyte to be used is changed, nickel and iron foil can also be produced. For example, nickel is formed by dipping a drum in an electrolyte bath of nickel sulfamic acid. Iron is formed by dipping a drum in an electrolyte bath of ferrous chloride and ferrous sulfamic acid.

A thickness of the metal foil substrate 1 formed by the electroforming is desired to be not less than 10 μm in viewpoint of its structure and mechanical strength in dealing. In this embodiment, the metal foil substrate 1 is a copper foil of 18 μm in thickness and a height of the rough shape is 3 μm of mean roughness depth. Through the following processes for forming a thin film, the substrate 1 is fixed to a substrate jig of such as glass. The substrate 1 is fixed to the substrate jig with heat-resistant adhesive tape with less degassing. The adhesive tape used in this embodiment is heat-resistant tape of which base material is polyimide and adhesive material is silicon.

Then, transparent conductive material layer 2 of such as tin oxide, indium tin oxide, and zinc oxide is coated on the metal foil substrate 1 by thermal CVD or sputtering. In this embodiment, zinc oxide (ZnO) of 500 Å is coated on the substrate 1 by radio frequency (RF) sputtering. The layer is formed under the condition of argon (Ar) gas atmosphere, reaction pressure 0.665 Pa, radio frequency power density 2 W/cm$^2$, substrate temperature of room temperature.

Then, a photovoltaic conversion layer 3 of a thin film semiconductor layer mainly containing amorphous silicon or the like is formed on the transparent conductive material layer 2. The photovoltaic conversion layer 3 of this embodiment is formed by laminating an n-type layer of amorphous silicon layer of 200 Å, an i-type layer of amorphous silicon layer of 3000 Å, and a p-type layer of amorphous silicon carbide layer of 100 Å in this order from a side of the rough metal foil substrate 1. Conditions for forming each of the layers are shown in Table 1.

TABLE 1

|  | Reaction gas | Radio frequency power density (mW/cm$^2$) | Substrate temperature (° C.) | Reaction pressure (Pa) |
|---|---|---|---|---|
| n-type layer | PH$_3$:SiH$_4$:H$_2$ = 0.1:10:20 | 30 | 200 | 26.6 |
| i-type layer | H$_2$:SiH$_4$ = 4:1 | 45 | 200 | 26.6 |
| p-type layer | B$_2$H$_6$:CH$_4$:H$_2$:SiH$_4$ = 0.1:5:20:10 | 45 | 100 | 39.9 |

Then, a transparent electrode layer 4 of transparent conductive material such as indium tin oxide, and zinc oxide is formed on the photovoltaic conversion layer 3 by sputtering. In this embodiment, indium tin oxide (ITO) of 700 Å is formed by radio frequency (RF) sputtering. The layer is formed under conditions of argon (Ar) gas atmosphere, reaction pressure of 0.665 Pa, radio frequency power density of 2 W/cm$^2$, and 200° C. substrate temperature.

Then, a comb-shaped electrode 5 of such as aluminum and silver having good conductivity is formed on the transparent electrode layer 4. In this embodiment, silver (Ag) is deposited by a vacuum evaporation method. Through these processes, a solar cell device 10 according to this invention is formed. Incident light 6 enters from a side of the transparent electrode layer 4.

Figure 2:
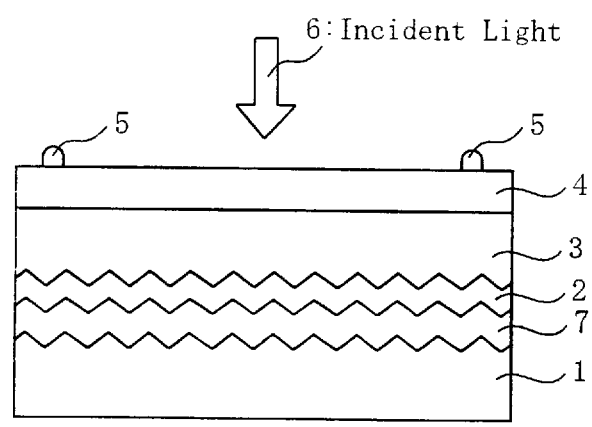
FIG. 2 is a cross sectional view illustrating a structure of a thin film solar cell device of the second embodiment according to this invention.

Explanation of the second embodiment of this invention by referring to FIG. 2 follows. FIG. 2 is a cross sectional view illustrating a structure of a thin film solar cell device of the second embodiment. The same elements as in the first embodiment are given the same reference numbers and explanation of them are omitted to prevent duplication.

A solar cell device 10 of the second embodiment is different from that of the first embodiment in that a metal layer 7 of relatively high reflectivity such as aluminum and silver is deposited so as to improve optical reflectivity of the substrate.

The metal layer of high optical reflectivity of the second embodiment is formed by coating silver (Ag) of 3000 Å in thickness on the rough metal foil substrate 1 by radio frequency (RF) sputtering. The silver is formed under the conditions of argon (Ar) gas atmosphere, reaction pressure of 0.399 Pa, radio frequency power density of 3 W/cm$^2$, a substrate temperature of room temperature.

Then a transparent conductive material layer 2 of such as tin oxide, indium tin oxide, and zinc oxide is coated on the metal layer 7 by sputtering.

Then, a photovoltaic conversion layer 3 of a thin film semiconductor layer mainly containing amorphous silicon or the like is formed on the transparent conductive material layer 2. As like in the first embodiment, an n-type layer of amorphous silicon layer of 200 Å, an i-type layer of amorphous silicon layer of 3000 Å, a p-type layer of amorphous silicon carbide layer of 100 Å are laminated in this order from the rough metal foil substrate 1.

Then, a transparent electrode layer 4 of transparent conductive material such as indium tin oxide, and zinc oxide is formed on the photovoltaic conversion layer 3 by sputtering.

A comb-shaped electrode 5 is formed with metal material of good conductivity such as aluminum and silver on the transparent electrode layer 4. Through these processes, the solar cell device 10 according to this invention is formed. The incident light 6 enters from a side of the transparent electrode layer 4.

Figure 3:
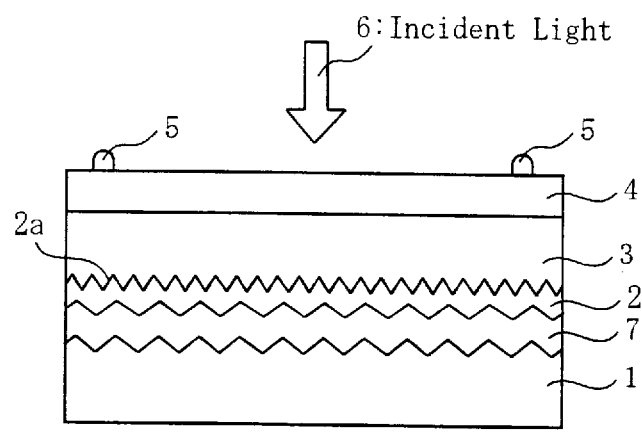
FIG. 3 is a cross sectional view illustrating a structure of a thin film solar cell device of the third embodiment according to this invention.

Explanation of the third embodiment by referring to FIG. 3 follows. FIG. 3 is a cross sectional view illustrating a thin film solar cell device of the third embodiment according to this invention. The same elements as in the first embodiment are given the same reference numerals and explanation of them are omitted to prevent duplication.

The solar cell device 10 of the third embodiment is different from that of the second embodiment in a surface shape of the transparent conductive material layer 2 formed on the metal layer 7. In the third embodiment, the metal layer 7 is formed on the rough metal foil substrate 1, and the transparent conductive material layer 2 of such as tin oxide, indium tin oxide, and zinc oxide is coated on the metal layer 7 by thermal CVD, or sputtering. Then, the transparent conductive material layer 2 is wet-etched to form a rough shape 2a of 0.02–0.5 μm of mean roughness depth (Rz) on the surface of the transparent conductive material layer.

In this embodiment, zinc oxide (ZnO) of 7000 Å is coated as the transparent conductive material layer 2 on the metal layer 7.

The rough shape of the surface of the transparent conductive material 2 is formed by dipping the metal layer 7 and the substrate 1 with the transparent conductive material 2 coated thereon in aqueous solution of 1.0% hydrochloric acid (HCl) at a room temperature for 30 seconds. The wet-etched transparent conductive material 2 has a thickness of 3000 Å and the mean roughness depth of the surface 2a is 0.1 μm.

Then, the photovoltaic conversion layer 3 of a thin film semiconductor layer mainly containing amorphous silicon or the like is formed on the surface 2a of the transparent conductive material 2. As like in the first and second embodiments, an n-type layer of amorphous silicon layer of 200 Å, an i-type layer of amorphous silicon layer of 3000 Å, a p-type layer of amorphous silicon carbide layer of 100 Å are laminated in this order from a side of the rough metal foil substrate 1.

Then, the transparent electrode layer 4 of transparent conductive material such as indium tin oxide, and zinc oxide is formed on the photovoltaic conversion layer 3 by sputtering.

The comb-shaped electrode 5 is formed with metal material of good conductivity such as aluminum and silver on the transparent electrode layer 4. Through these processes, the solar cell device 10 according to this invention is formed. The incident light 6 enters from a side of the transparent electrode layer 4.

With this structure, the conversion efficiency of the thin film solar cell further improves.

In the third embodiment, the metal layer of relatively high reflectivity of such as aluminum and silver is deposited on the rough metal layer substrate 1. Other than this, it may be possible as in the first embodiment that a rough shape of 0.2–0.5 μm of mean roughness depth (Rz) is formed on the surface of the transparent conductive material layer by wet-etching the transparent conductive material layer 2 after coating it on the rough metal substrate 1. In this case, the conversion efficiency of the thin film solar cell is also expected to improve.

The transparent conductive material layer 2 of the third embodiment is wet-etched by 0.1–2% hydrochloric acid after forming a zinc oxide layer of approximately 0.7–1 μm. The wet-etching can be conducted by using acetic acid aqueous solution other than hydrochloric acid and dipping the layer in it for 10–60 seconds at a room temperature. The rough shape 2a of the transparent conductive material layer 2 can also be formed by dry etching and ion etching.

The transparent conductive material layer 2 of such as tin oxide, indium tin oxide, and zinc oxide having a fine rough shape formed on the metal foil substrate 1 enables to utilize incident light such as sunlight so as to improve efficiency of the solar cell.

Then, characteristics of the thin film solar cells of the first-third embodiments and a thin film solar cell of a conventional structure are compared. For the thin film solar cell of the conventional structure, a substrate of a glass coated with tin oxide ($SnO_2$) of a rough shape, and a substrate of rolled stainless steel (SUS304) of 500 μm in thickness are prepared, and thin film solar cells are formed on the substrates as in the same way of the second embodiment. Characteristics of these five cells are shown in Table 2. Table 2 indicates standardized characteristics of the thin film solar cell devices using the substrate of a glass coated with tin oxide of a rough shape.

TABLE 2

|  | Voc | Isc | F.F. | Vop | Iop | Rs | Rsh | η | Yield |
|---|---|---|---|---|---|---|---|---|---|
| 1st embodiment | 0.99 | 0.95 | 1.0 | 1.0 | 0.89 | 1.56 | 1.37 | 0.94 | 0.93 |
| 2nd embodiment | 1.01 | 0.99 | 1.01 | 1.02 | 0.99 | 0.88 | 1.01 | 1.01 | 1.02 |
| 3rd embodiment | 1.02 | 1.19 | 0.94 | 0.98 | 1.13 | 0.97 | 0.43 | 1.14 | 1.0 |
| Conventional glass/rough-shaped $SnO_2$ substrate | 1.0 | 1.0 | 1.0 | 1.0 | 1.0 | 1.0 | 1.0 | 1.0 | 1.0 |
| Rolled SUS304 substrate | 0.0 | 0.9 | 0.0 | 0.0 | 0.9 | 0.0 | 0.0 | 0.0 | 0.0 |

In Table 2, Voc is an open voltage, Isc is short-circuited electric current, F.F. is a fill factor, Vop is an optimized operation voltage, Iop is optimized operation electric current, Rs is series resistance, Rsh is shunt resistance, (η) is conversion efficiency.

As indicated in Table 2, comparison of conversion efficiency (η) and other solar cell characteristics of the thin film solar cell devices using the substrates of the glass coated with tin oxide ($SnO_2$) having a rough shape indicates that the characteristics of the cell of the first embodiment is close to that of the conventional one, those of the cell of the second embodiment is approximately the same, and of the third embodiment is improved approximately 10%. As for the yields of the thin film solar cells of the first-third embodiments are approximately the same as that of the cell using the conventionally used substrate of the glass coated with tin oxide ($SnO_2$) having a rough shape.

All of the thin film solar cells formed on the rolled SUS 304 substrate are short-circuited, and the yield is 0%. This is because that the metal substrate formed by rolling has sharp protrusions on a substrate surface and the protrusions can not be coated by the metal electrodes 7 and the transparent conductive material layer 2, resulting in conduction of the metal substrate and the transparent conductive material 4.

The solar cell according to this invention can achieve approximately the same conversion efficiency as compared with the conventional thin film solar cell device using the substrate of the glass coated with tin oxide ($SnO_2$) having a rough shape, and can achieve high yields as compared with that using the metal substrate formed by general rolling.

Then, cost for the solar cell of this invention is compared with that of the conventional structure. Comparison is made regarding cost for the substrates themselves. The substrate of the glass coated with tin oxide ($SnO_2$) having a rough shape costs approximately 4000 yen per 1 $m^2$. The substrate of the SUS substrate coated with tin oxide ($SnO_2$) having a rough shape costs approximately 2000 yen per 1 $m^2$. The substrate of a copper foil formed by electroforming costs approximately 250–300 yen per 1 $m^2$. Thus, the substrate using the electroformed metal foil can greatly reduce the cost.

When base material for coating with the electroformed copper foil is a SUS plate, the cost increases approximately by 1000 yen. However, the total cost for the substrate can still be less than the conventional substrate even when the base material is the SUS plate.

Figure 5:
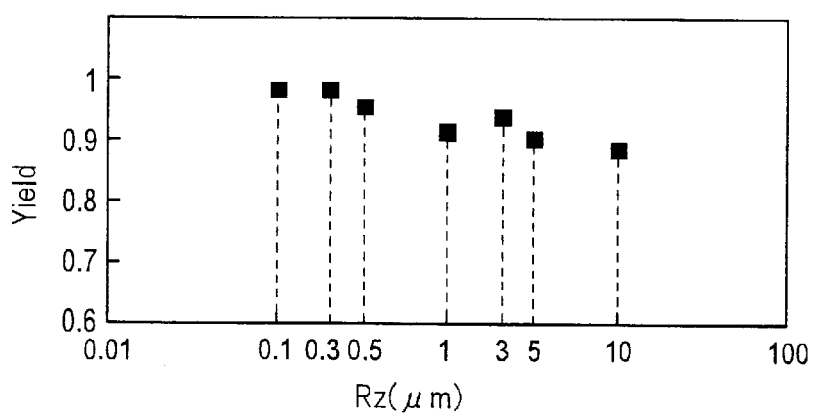
FIG. 5 is a diagram illustrating relation between measured roughness formed on a surface of a metal foil and yield.

Then, a suitable range of mean roughness depth (Rz) of the rough shape on the substrate surface is examined. FIG. 5 indicates results of the yields of copper foils having different roughness of rough shapes on the surfaces formed by electroforming. FIG. 5 illustrates relation between yields and mean roughness depth (Rz) from 0.1–25 μm.

The result shows that the copper foil having the mean roughness depth (Rz) not more than 0.1 μm is difficult to form, and when the copper foil of the mean roughness depth (Rz) is over 13 μm, the yields is not more than 0.5, When over 25 μm, the yield is zero.

The rough shape of the metal foil surface preferably has mean roughness depth of 0.1–10 μm when considering yields.

Figure 6:
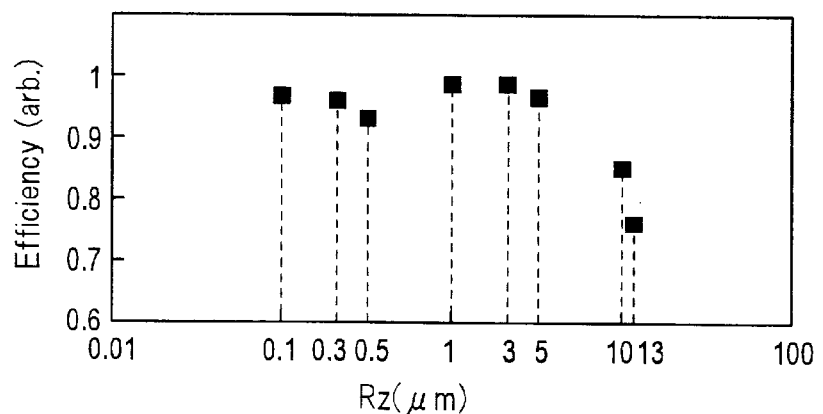
FIG. 6 is a diagram illustrating relation between measured roughness formed on the surface of a metal foil and conversion efficiency.

Then, conversion efficiency of the thin film solar cell of the first embodiment using the substrate of the copper foil having a rough shape of 0.1–10 μm mean roughness depth is examined. The results are shown in FIG. 6. FIG. 6 indicates standardized characteristics of the thin film solar cell device using a substrate of the glass coated with tin oxide ($SnO_2$).

As shown in FIG. 6, when the rough shape has the mean roughness shape of 0.1–5 μm, the conversion efficiency of not less than 0.97 is obtained. Therefore, the rough shape formed on the metal foil surface is preferred to be 0.1–5 μm of mean roughness shape (Rz) when considering the conversion efficiency.

As described in the third embodiment, a suitable range of the mean roughness depth of the rough shape formed by etching the surface of the transparent conductive material layer is examined. Table 3 shows the yields when the copper foil has different rough shapes to be formed on the surface, and the mean roughness depth of the rough shapes to be formed on the surface of the transparent conductive material layer is varied by changing etching conditions. Zinc oxide (ZnO) is used as the transparent conductive material (TCO).

TABLE 3

| Yield | | Rz of TCO | | | | | | |
|---|---|---|---|---|---|---|---|---|
| | | 0.02 | 0.05 | 0.1 | 0.2 | 0.3 | 0.5 | 1 |
| Rz of copper foil | 0.1 | 0.95 | 0.87 | | | | | |
| | 0.3 | 0.97 | 0.96 | 0.88 | 0.33 | Unable to form TCO | | |
| | 0.5 | 0.95 | 0.95 | 0.96 | 0.89 | 0.75 | | |
| | 1 | 0.96 | 0.92 | 1 | 0.95 | 0.96 | 0.9 | |
| | 3 | 0.95 | 1 | 0.98 | 1 | 1.02 | 0.94 | 0.16 |
| | 5 | 0.91 | 0.98 | 0.96 | 1 | 0.92 | 0.89 | 0.12 |
| | 10 | 0.88 | 0.92 | 0.96 | 0.92 | 0.84 | 0.81 | 0 |
| | 13 | 0.33 | 0.47 | 0.4 | 0.36 | 0.45 | 0.24 | 0 |
| | 25 | 0 | 0 | 0 | 0 | 0 | 0 | 0 |

As shown in FIG. 5, the mean roughness depth (Rz) of the rough shape formed on the surface metal foil is required to be approximately 0.1–10 μm, and the mean roughness depth (Rz) of the rough shape formed on the surface of the transparent conductive material (TCO) layer is required to be 0.02–0.5 μm as shown in Table 3.

Then, conversion efficiency of the thin film solar cells of the third embodiment is examined. The substrates used has the copper foils having rough shapes of various mean roughness depth of 0.1–10 μm, and the transparent conductive material (TCO) layer has rough shapes of various mean roughness depth. The results are shown in Table 4. Table 4 shows standardized characteristics of the thin film solar cell using a substrate of the glass coated with tin oxide ($SnO_2$) having the rough shape.

TABLE 4

| Efficiency | | Rz of TCO | | | | | | |
|---|---|---|---|---|---|---|---|---|
| | | 0.02 | 0.05 | 0.1 | 0.2 | 0.3 | 0.5 | 1 |
| Rz of copper foil | 0.1 | 0.95 | 0.88 | | | | | |
| | 0.3 | 0.97 | 0.96 | 0.88 | 0.82 | Unable to form TCO | | |
| | 0.5 | 0.95 | 0.90 | 1.05 | 1.03 | 1.01 | | |
| | 1 | 1 | 0.97 | 1 | 1.08 | 0.98 | 0.9 | |
| | 3 | 0.95 | 1.02 | 1.14 | 1.1 | 1.02 | 1.02 | 0.75 |
| | 5 | 0.91 | 0.98 | 0.98 | 1.05 | 1.02 | 1 | 0.8 |
| | 10 | 0.87 | 0.95 | 1.03 | 1.01 | 1.03 | 1.02 | 0 |
| | 13 | 0.79 | 0.77 | 0.83 | 0.81 | 0.75 | 0.76 | 0 |
| | 25 | 0 | 0 | 0 | 0 | 0 | 0 | 0 |

When the rough shape of the copper foil has the mean roughness depth (Rz) of 0.1–10 μm as shown in FIG. 6 and the rough shape of the transparent conductive material (TCO) layer has the mean roughness depth (Rz) of 0.02–0.5 μm as shown in Table 4, the conversion efficiency of not less than 0.9 is obtained. Therefore, when considering the conversion efficiency too, the mean roughness depth of the rough shape of the metal foil is preferred to be 0.1–10 μm, and of the transparent conductive material (TCO) layer is preferred to be 0.02–0.5 μm.

In addition, Table 4 shows that the mean roughness depth of the rough shape of the metal foil is further preferred to be 3–10 μm, and of the transparent conductive material (TCO) is further preferred to be 0.1–0.5 μm.

Figure 7:
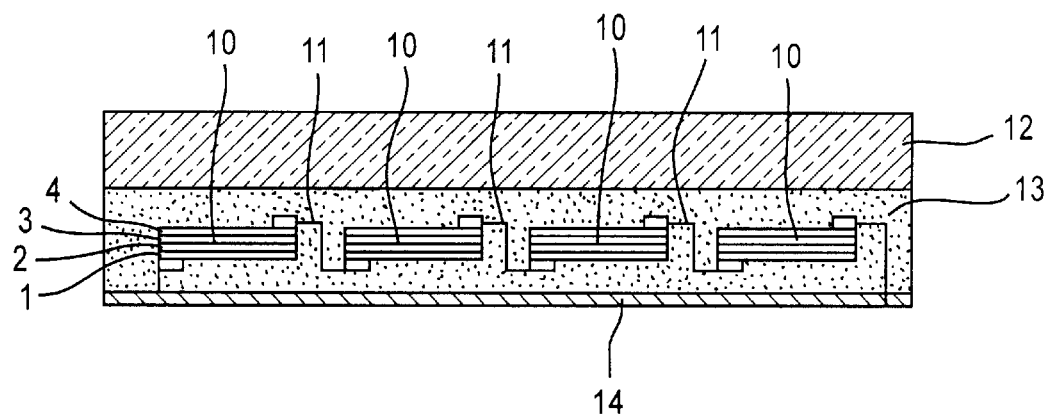
FIG. 7 is a schematic cross sectional view illustrating an integrated structure of the thin film solar cell devices of the first, second, or third embodiment.

Explanation of a method for integrating the solar cell devices of the structures shown in FIGS. 1–3 by referring to FIG. 7 follows. As shown in FIG. 7, the thin film solar cell device 10 having the structure shown in either of FIGS. 1–3 is formed, and the rough metal foil substrate 1 and the transparent electrode layer 4 are connected by a connection tab 11 having good conductivity. A plurality of the thin film solar cell devices 10 connected with each other are arranged so that a side of the transparent electrode layer 4 is positioned on a front surface glass side. Then, the plurality of the thin film solar cell devices 10 are sealed between the front surface glass 12 and a rear surface film 14 with sealing resin 13 of such as EVA (ethylene vinyl acetate) to integrate the cell devices.

Figure 8:
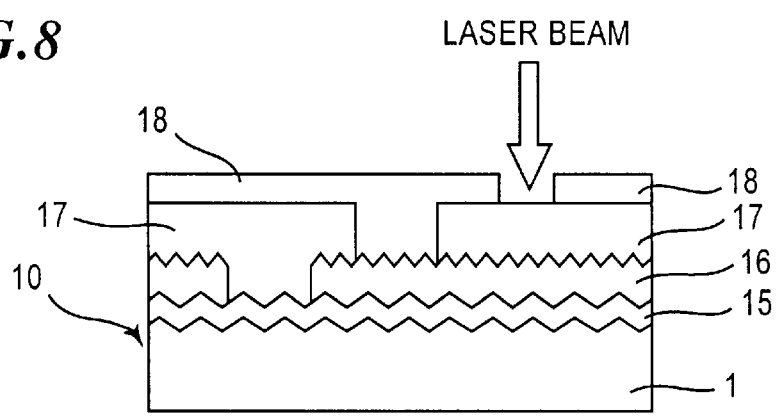
FIG. 8 is a cross sectional view illustrating a structure of a thin film solar cell device of the fourth embodiment according to this invention.
Figure 9:
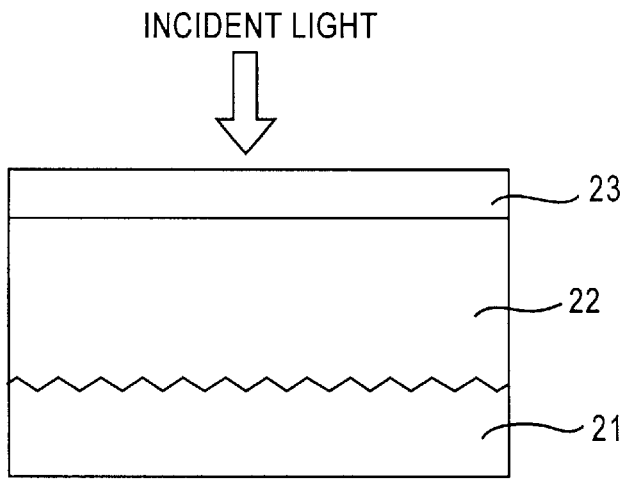
FIG. 9 is a cross sectional view illustrating a structure of a conventional thin film solar cell device.

Explanation of the fourth embodiment of this invention by referring to FIG. 8 follows. FIG. 8 is a cross sectional view illustrating a structure of the thin film solar cell of the fourth embodiment according to this invention. In the fourth embodiment, a plurality of photovoltaic conversion elements are provided on a substrate 1 and these elements are connected and integrated to form an integration type solar cell device.

As shown in FIG. 8, an insulative resin layer 15 of such as polyimide is formed on the rough metal foil substrate 1 and the transparent conductive material 16 is formed. Then, the transparent conductive material layer 16 is selectively patterned by YAG laser, SHG laser, excimer layer or the like. A photovoltaic conversion layer 17 of a thin film semiconductor having n-i-p junction as in the first embodiment is formed on the transparent conductive material layer 16. Then, the photovoltaic conversion layer 17 is selectively patterned. A transparent electrode layer 18 is formed on the photovoltaic conversion layer 17 and is selectively patterned to integrate the cells.

The thin film solar cell device produced in this embodiment can obtain approximately the same conversion efficiency as that of the substrate of the glass coated with transparent conductive material layer such as tin oxide ($SnO_2$), indium tin oxide (ITO), and zinc oxide (ZnO) having the rough shape which is used conventionally.

When optical reflectivity of the rough metal foil substrate 1 is low, a thin metal layer of relatively high reflectivity formed of such as aluminum and silver may be deposited on the rough metal foil substrate 1 or on the insulative resin layer 15 before forming the transparent conductive material layer 16 so as to improve optical reflectivity.

As in the third embodiment, the transparent conductive material layer 16 of such as tin oxide, indium tin oxide, and zinc oxide having a fine rough shape may be formed on the metal foil substrate 1. With this shape of the transparent conductive material layer 16, incident light such as sunlight can be effectively utilized and efficiency of the solar cell improves.

Although the thin film solar cell device of these embodiment is an amorphous silicon based thin film solar cell device, this invention may be applicable to thin film solar cell devices of a compound semiconductor based thin film solar cell device, a thin film polycrystalline silicon solar cell device or the like.

As described above, this invention can provide a solar cell device for power generation capable of reducing cost for manufacture because through put in forming a rough shape, and cost for the rough-shaped metal foil substrate itself is less as compared with a substrate of a glass coated with the transparent conductive material of such as tin oxide, indium tin oxide, and zinc oxide.

Furthermore, the thin film solar cell device using the rough-shaped substrate formed of a metal foil is light-weighted. Therefore, even when the size of the solar cell module increases, the weight is relatively small and workability is good.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A solar cell device comprising:
a metal foil formed by electroforming;
a transparent conductive material layer formed on the metal foil;
a photovoltaic layer of a thin film semiconductor layer having a semiconductor junction formed on the transparent conductive material layer, wherein a rough shape of approximately 0.02–0.05 μm of mean roughness depth (Rz) is formed on a surface of the transparent conductive material layer, and the metal foil formed by electroforming has a rough shape of approximately 0.1–0.3 μm of mean roughness depth (Rz) on a surface of the metal foil.

2. A solar cell device comprising:
a metal foil formed by electroforming;
a transparent conductive material layer formed on the metal foil;
a photovoltaic layer of a thin film semiconductor layer having a semiconductor junction formed on the transparent conductive material layer, wherein a rough shape of approximately 0.02–0.2 μm of mean roughness depth (Rz) is formed on a surface of the transparent conductive material layer, and the metal foil formed by electroforming has a rough shape of approximately 0.3–0.5 μm of mean roughness depth (Rz) on a surface of the metal foil.

3. A solar cell device comprising:
a metal foil formed by electroforming;
a transparent conductive material layer formed on the metal foil;
a photovoltaic layer of a thin film semiconductor layer having a semiconductor junction formed on the transparent conductive material layer, wherein a rough shape of approximately 0.02–0.3 μm of mean roughness depth (Rz) is formed on a surface of the transparent conductive material layer, and the metal foil formed by electroforming has a rough shape of approximately 0.5–1 μm of mean roughness depth (Rz) on a surface of the metal foil.

4. A solar cell device comprising:
a metal foil formed by electroforming;
a transparent conductive material layer formed on the metal foil;
a photovoltaic layer of a thin film semiconductor layer having a semiconductor junction formed on the transparent conductive material layer, wherein a rough shape of approximately 0.02–0.5 μm of mean roughness depth (Rz) is formed on a surface of the transparent conductive material layer, and the metal foil formed by electroforming has a rough shape of approximately 1–10 μm of mean roughness depth (Rz) on a surface of the metal foil.

5. A solar cell device comprising:

a metal foil formed by electroforming;

a conductive material layer of high optical reflectivity formed on the metal foil;

a transparent conductive material layer formed on the conductive material layer;

a photovoltaic layer of a thin film semiconductor layer having a semiconductor junction formed on the transparent conductive material layer, wherein the metal foil formed by electroforming has a rough shape of approximately 0.1–0.3 µm of mean roughness depth (Rz) on a surface of the metal foil, and a rough shape of approximately 0.02–0.5 µm of mean roughness depth (Rz) is formed on a surface of the transparent conductive material layer.

6. A solar cell device comprising:

a metal foil formed by electroforming;

a conductive material layer of high optical reflectivity formed on the metal foil;

a transparent conductive material layer formed on the conductive material layer;

a photovoltaic layer of a thin film semiconductor layer having a semiconductor junction formed on the transparent conductive material layer, wherein the metal foil formed by electroforming has a rough shape of approximately 0.3–0.5 µm of mean roughness depth (Rz) on a surface of the metal foil, and a rough shape of approximately 0.02–0.2 µm of mean roughness depth (Rz) is formed on a surface of the transparent conductive material layer.

7. A solar cell device comprising:

a metal foil formed by electroforming;

a conductive material layer of high optical reflectivity formed on the metal foil;

a transparent conductive material layer formed on the conductive material layer;

a photovoltaic layer of a thin film semiconductor layer having a semiconductor junction formed on the transparent conductive material layer, wherein the metal foil formed by electroforming has a rough shape of approximately 0.5–1 µm of mean roughness depth (Rz) on a surface of the metal foil, and a rough shape of approximately 0.02–0.3 µm of mean roughness depth (Rz) is formed on a surface of the transparent conductive material layer.

8. A solar cell device comprising:

a metal foil formed by electroforming;

a conductive material layer of high optical reflectivity formed on the metal foil;

a transparent conductive material layer formed on the conductive material layer;

a photovoltaic layer of a thin film semiconductor layer having a semiconductor junction formed on the transparent conductive material layer, wherein the metal foil formed by electroforming has a rough shape of approximately 1–10 µm of mean roughness depth (Rz) on a surface of the metal foil, and a rough shape of approximately 0.02–0.5 µm of mean roughness depth (Rz) is formed on a surface of the transparent conductive material layer.

* * * * *